United States Patent
Douglas et al.

(10) Patent No.: US 6,396,199 B1
(45) Date of Patent: May 28, 2002

(54) ULTRASONIC LINEAR OR CURVILINEAR TRANSDUCER AND CONNECTION TECHNIQUE THEREFORE

(75) Inventors: Stephen Douglas, Cary; Shinji Ogawa, Norrisville, both of NC (US)

(73) Assignee: Prosonic Co., Ltd., Kyongbuk (KR)

( * ) Notice: Subject to any disclaimer, the term of this patent is extended or adjusted under 35 U.S.C. 154(b) by 0 days.

(21) Appl. No.: 09/608,212

(22) Filed: Jun. 30, 2000

Related U.S. Application Data

(60) Provisional application No. 60/142,059, filed on Jul. 2, 1999.

(51) Int. Cl.[7] .............................................. H01L 41/08
(52) U.S. Cl. ....................................... 310/335; 310/334
(58) Field of Search ................................. 310/334–337

(56) References Cited

U.S. PATENT DOCUMENTS

| | | | |
|---|---|---|---|
| 3,387,604 A | | 6/1968 | Erikson |
| 3,663,842 A | * | 5/1972 | Miller ..................... 310/335 X |
| 4,217,516 A | | 8/1980 | Iinuma et al. |
| 4,507,582 A | * | 3/1985 | Glenn ..................... 310/335 X |
| 4,699,150 A | | 10/1987 | Kawabuchi et al. |
| 4,773,267 A | * | 9/1988 | Abts ....................... 310/335 X |
| 5,176,140 A | * | 1/1993 | Kami et al. ............. 310/335 X |
| 5,296,777 A | | 3/1994 | Mine et al. |
| 5,774,960 A | | 7/1998 | De Fraguier et al. |
| 5,792,058 A | | 8/1998 | Lee et al. |
| 5,984,871 A | * | 11/1999 | Tan Hoff et al. ........ 310/335 X |

FOREIGN PATENT DOCUMENTS

JP     01027400     1/1989

* cited by examiner

*Primary Examiner*—Mark O. Budd

(57) ABSTRACT

A double-sided flexible circuit is used to provide interconnection to a piezoelectric ultrasonic transducer array. The ultrasonic crystal is covered with first and second electrode layers having an insulation gap provided therebetween. The flexible circuit material is then bonded to the first and second electrode layers so that one side of the double sided flexible circuit makes contact to one set of transducer electrodes and the other side of the flexible circuit makes contact to the second set of transducer electrodes. The ultrasonic transducer desirably includes a concave acoustic lens having an acoustic velocity greater than water.

15 Claims, 4 Drawing Sheets

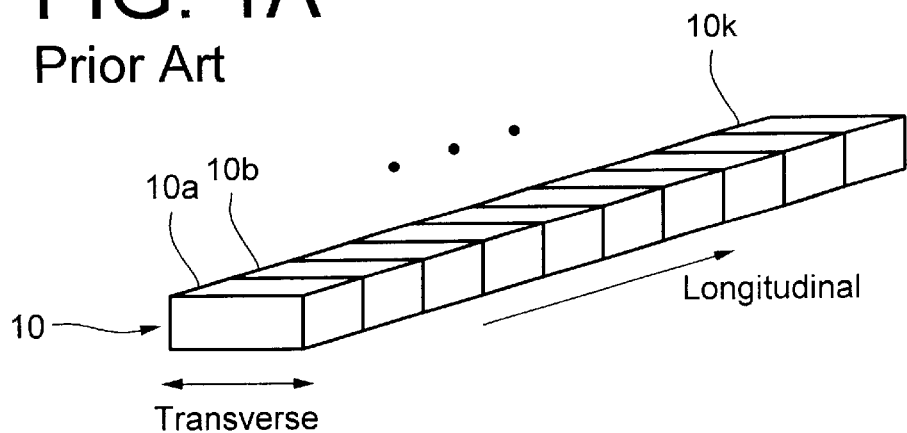
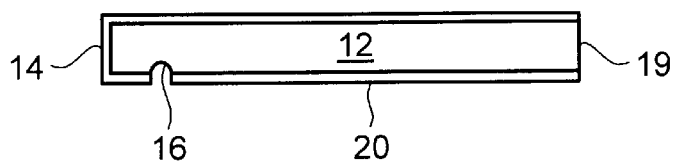
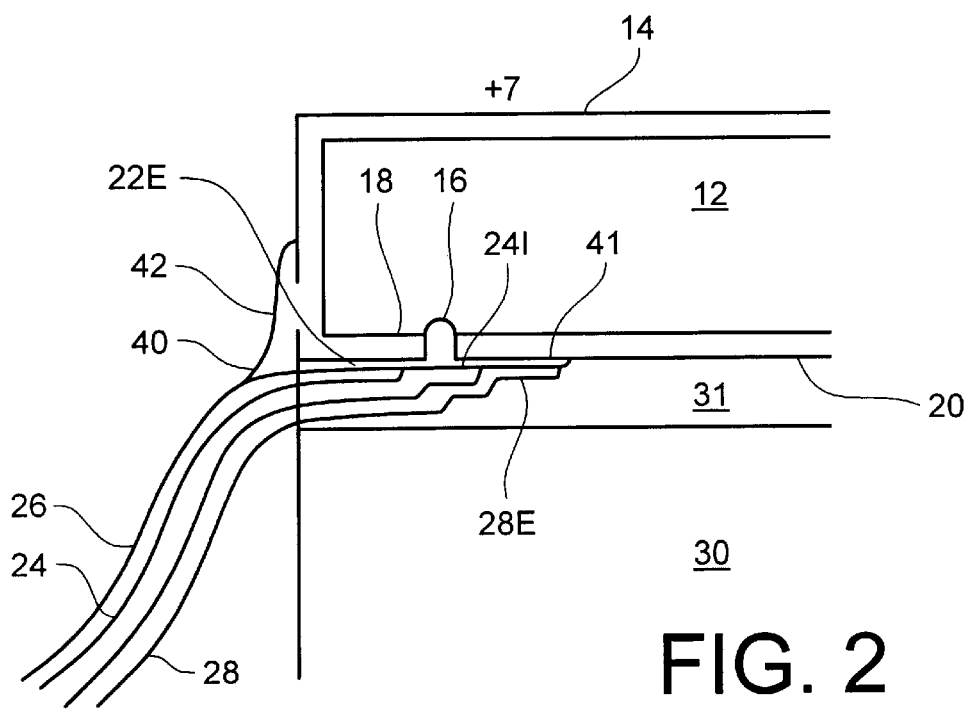

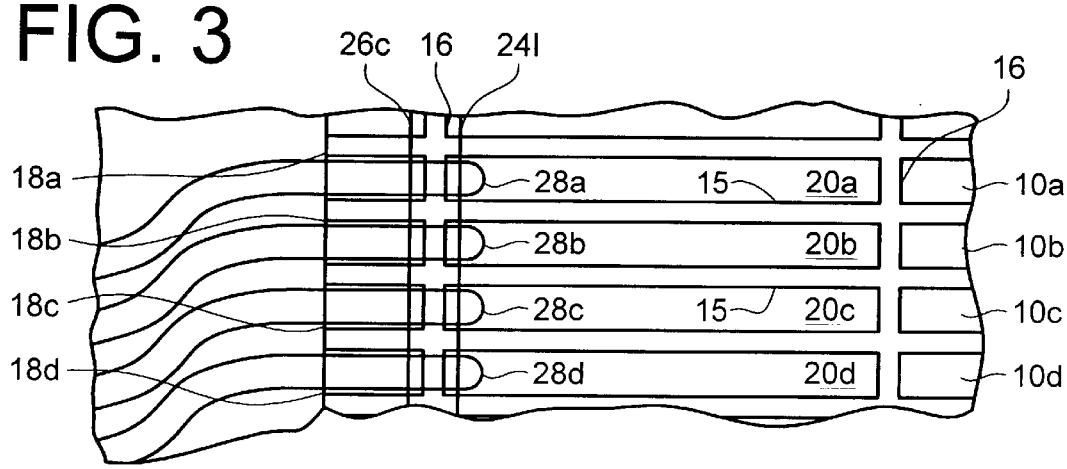
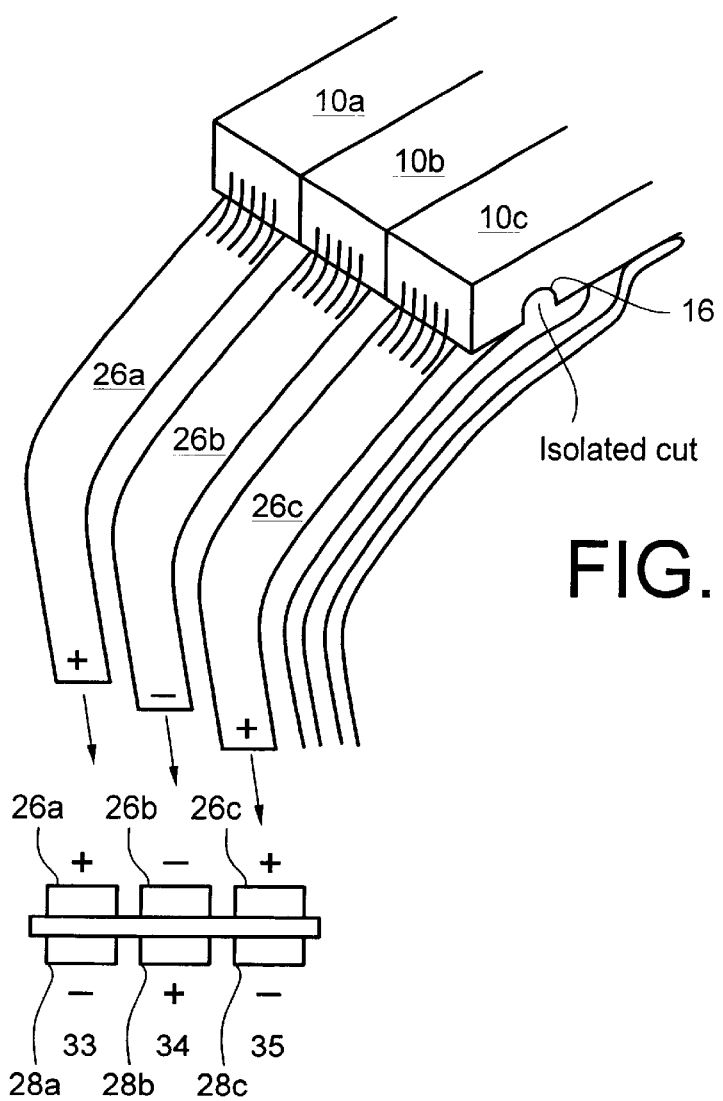

US 6,396,199 B1

ULTRASONIC LINEAR OR CURVILINEAR TRANSDUCER AND CONNECTION TECHNIQUE THEREFORE

This application claims benefit to U.S. provisional application Ser. No. 60/142,059, filed Jul. 2, 1999.

FIELD OF INVENTION

The present application is generally directed to the field of linear or curvilinear ultrasonic transducers, particularly those used in medical imaging.

BACKGROUND OF THE INVENTION

Ultrasonic imaging has been utilized for a number of years in the medical field. Linear and curvilinear ultrasonic transducers are used to produce visual images of features within a patient's body. Such ultrasonic imaging transducers are also used in other fields. However, medical imaging is perhaps the best known use of such transducers.

Typically, an ultrasonic transducer for producing visual images of features inside the body includes an array of ultrasonic elements which may be driven by a desired excitation and/or receive ultrasonic reflections obtained from various features of interest.

As technology progresses, there has been an increasing need to produce ultrasonic images having enhanced resolution. There is also, of course, a desire to produce ultrasonic transducers producing not only better images, but exhibiting greater reliability and ease of manufacture.

In a typical ultrasonic transducer array, a piezoelectric crystal is driven by a voltage applied across first and second piezoelectric electrodes. Such an ultrasonic transducer is generally formed of a piezoelectric crystal that is provided with first and second piezoelectric electrodes to form a electrode crystal assembly. This electrode crystal assembly is then fastened to a backing, and the piezoelectric crystal with its associated piezoelectric electrodes is then cut transversely into individual electrode elements extending along a longitudinal direction.

One of the limiting factors in manufacturing such piezoelectric ultrasonic transducers is that, as transducer elements size decreases, the difficulty in affixing contact wiring to the transducer increases. Such contact wiring is needed to connect the acoustic transducer with its associated drive or sensing circuitry.

SUMMARY OF THE INVENTION

According to the teachings of the present application, a double sided flexible circuit, flex circuit or connector is used to contact both of the electrodes used to drive or sense a vibration within the piezoelectric crystal. According to the teachings of the present application, the first and second piezoelectric electrodes are connected to the flexible double sided circuit or connector either by soldering the flexible double sided connector to the piezoelectric electrodes or alternatively through the use of anisotropic conductive adhesive. When the flexible double sided connector is bonded to the piezoelectric electrodes, a fillet in the bonding material is used to strengthen the connection. In the case of a soldering method, this fillet would of course be a solder. However, this fillet could additionally be formed of a conductive epoxy by screen printing or another process. Anisotropic conductive adhesive may also be used to connect the flexible connector to the transducer.

In one preferred embodiment, one of the first and second connector conductors is a common conductor commonly connected to all of either the first and second piezoelectric electrodes. The second connector conductor is, in this case, however, constructed of a plurality of individual conductors each connected to an individual piezoelectric transducer element. In an alternative embodiment, individual grounds are used and accessed to individually drive or sense from each of the piezoelectric transducer elements. Thus, both sides of the flexible double sided connector contains individual electrodes for connecting to each of the piezoelectric elements.

In yet another embodiment, piezoelectric transducer element density can be increased by utilizing two flexible double sided connectors, connecting to the piezoelectric electrodes of the piezoelectric crystal from two sides. This enables each connector conductor of the double sided flexible connector to access only every other piezoelectric transducer element, thereby increasing the spacing or pitch of the conductive wirings provided on the flexible double sided connector to enable the pitch of the individual conductors on each flexible double sided connector to be reduced. Thus, the relative spacing of each connector wire as compared to its transducer element is increased. This can be done in two ways. Registration can be maintained between the first and second conductive contacts so that the two contacts of a single piezoelectric element are addressed from a single flexible circuit or double sided connector. Alternatively, it may be desirable to offset the first and second sides from each other in a single flexible double sided connector, so that each circuit element is contacted using a first flexible double sided connector and the second terminal is contacted using a second flexible double sided connector.

Through the use of individual grounds in accordance with the teachings of the present application, alternative piezoelectric elements may desirably have their grounds on opposite planes of the piezoelectric crystal. This may serve to reduce noise, for example, depending upon the driving system employed.

There are several other features of the present application which result in improved transducer. A concave lens having a transmission velocity substantially greater than water may be used to focus the transducer, particularly in the transverse direction. This lens is constructed in the preferred embodiment of an epoxy having a transmission velocity of greater than 1700 m/sec. In contrast, water has a transmission velocity of about 1500 m/sec. A shielding layer is desirably deposited outside of the piezoelectric crystal, associated matching layers, and acoustic lens. This shielding layer reduces electromagnetic interference as well as electrically shielding the patient from the sensor. By properly sizing the thickness of the shielding layer, the shield may attenuate electromagnetic radiation interference without substantially attenuating ultrasonic signal sensitivity. Desirably, this shield layer is vapor deposited to provide 100% coverage of the top surface and side walls of the transducer. The transducer of the present application further includes distended portions of the acoustical element, shielding layer and protective cover which extend over the side walls of the piezoelectric crystal and matching layers to protect the seams there between, including the adhesive binding the piezoelectric crystal to the backing and matching layer.

It should be apparent that the above features and advantages of the present invention filed from the preferred embodiments set forth here and below, as may be understood from the following description and accompanied drawings which illustrate exemplary embodiments of the present invention.

BRIEF DESCRIPTION OF THE DRAWINGS

FIG. 1A is a schematic illustration of a linear ultrasonic transducer used to explain the nomenclature used in such devices.

FIG. 1B is an alternative construction of the piezoelectric crystal 12 and piezoelectric electrode 18, 20 otherwise usable in the embodiment of FIG. 1.

FIG. 2 is an enlargement of a portion of the FIG. 1 illustration, better illustrating the connection of the flexible double sided connector to the piezoelectric crystal in accordance with the teachings of the present application.

FIG. 3 is a partial plan view of the underside of the piezoelectric crystal 12 and piezoelectric electrodes 18, 20, illustrating one example of the connection of the flexible double sided connector thereto.

FIG. 6 is a schematic illustration of a plurality of piezoelectric crystal transducer elements connected to plural wires of the first connector conductor, further illustrating the voltage pluralities supplied to the first and second piezoelectric electrodes of each piezoelectric crystal transducer element.

DETAILED DESCRIPTION OF PREFERRED EMBODIMENTS

FIG. 1A is a schematic illustration of a linear ultrasonic transducer including plural ultrasonic transducer elements 10a–k. This figure is primarily provided in the specification of the present application in order to define the terms longitudinal and transverse as used throughout the specification of the present applications. The term longitudinal is used to describe the direction along the length of the linear or curvilinear ultrasonic transducer 10 while the transverse direction is orthogonal thereto. While this figure illustrates a linear ultrasonic transducer, the transducer, within the contemplation of the present application, may curve in either the transverse or longitudinal direction to produce a curvilinear array.

Figure 1:
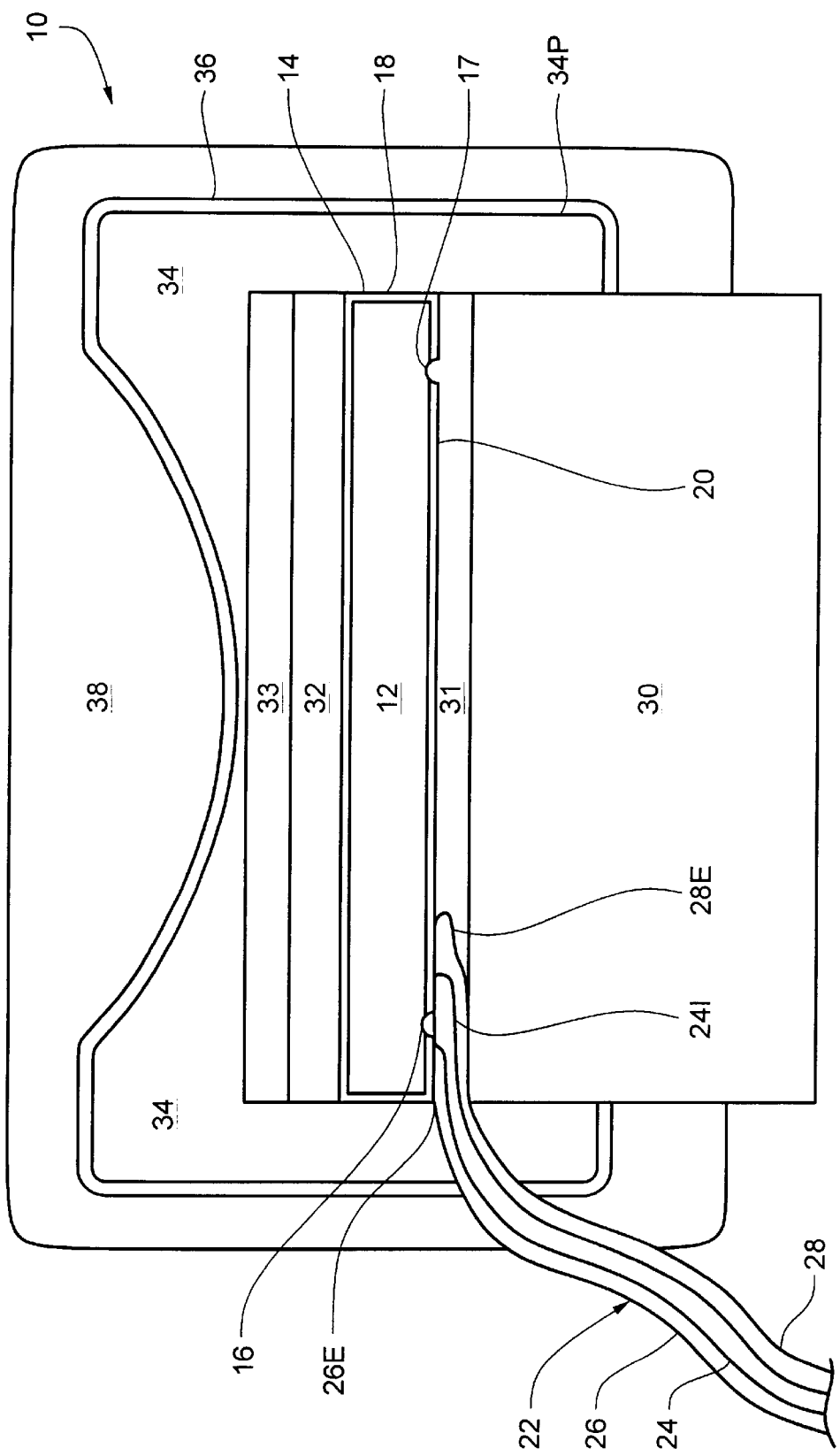
FIG. 1 is a cross-section of an exemplary transducer produced according to the teachings of the present invention.

Referring now to FIG. 1 of the present application, a piezoelectric crystal 12 is coated with a suitable conductor, for example copper, to produce a conductive coating 14. This conductive coating 14 is formed into first and second piezoelectric electrodes 18, 20 in order to produce a piezoelectric crystal 12 sandwiched by first and second piezoelectric electrodes 18, 20. Insulative gaps 16 are provided to divide the conductive coating 14 into the first and second piezoelectric electrodes 18, 20. Insulative gaps 16, 17 may be formed by any suitable process including dicing or etching.

In the embodiment of FIG. 1, the first and second piezoelectric electrodes 18, 20 are formed by completely coating the four sides of the piezoelectric crystal 12 with conductive material separated only at the ends in the longitudinal direction and divided by first and second insulation gaps 16, 17 by any substitute process. As an alternative, referencing FIG. 1B, only a single insulative gap 16 may be used, the first and second electrodes being otherwise separated by omitting a conductive coating from one side 19 to produce an insulative gap.

According to the teachings of the present application, a flexible double sided circuit or connector 22 is used to connect the piezoelectric transducer elements 10a–k to suitable drive or sensing circuitry as would occur to one of ordinary skill in the art. As may be better seen in FIGS. 3–5, the piezoelectric crystal 12 and its conductive coating 14 are typically diced to formed dicing gaps 15 which in turn produce the plural ultrasonic transducers elements 10a–k extending along the longitudinal axis of the transducer 10. This technique is generally well known in the art and is normally performed after the conductively coated piezoelectric crystal 12 is bonded to a backing 30 by a suitable adhesive 31 or alternating to a matching layer 32, 33.

In accordance with the teachings of the present application, prior to the bonding of the conductively coated piezoelectric crystal to the backing, a flexible double sided connector 22 is affixed to the piezoelectric crystal 12 and its associated electrodes 18, 20 as will be described below. After this bonding step is completed, a suitable adhesive 31 is used to bond the conductively coated piezoelectric crystal 12 to the backing 30.

The structure of the transducer of the present application further includes an inner matching layer 32 and outer matching layer 33. A acoustical focusing element 34 is further provided, the acoustical focusing element 34 including lamination protecting portions 34P extending around the periphery of the inner and outer matching layer 32, the conductively coated piezoelectric crystal 12, and all or part of the backing layer 30. In this way, the lamination protecting portion 34P of the acoustical focusing element 34 provides mechanical and moisture protection to the transducer structure to prevent layer separation.

The acoustical focusing element 34 of the present application is a concave lens having a acoustical velocity greater than that of water. In the preferred embodiment, the acoustical focusing element 34 is a concave lens formed of an epoxy or urethane having a transmission velocity of greater than 1700 m/sec and preferably about 2000 m/sec. This is compared to a typical acoustical transmission velocity of 1500 m/sec for water. Since the acoustical transmission velocity of the concave lens is greater than that of water, the concave lens will have the effect of focusing the acoustical energy to a focal point defined by the concave lens curvature.

According to the teachings of the present application, a shielding layer 36 is provided by vapor deposition of a suitable metallic electromagnetic shield on the top surface side walls and end walls of the transducer array. This shielding layer 36 improves sensing accuracy by reducing the transducers sensitivity to electro-magnetic interference and further isolates the patient from the transducer array. The shielding layer 36 also provides an effective moisture barrier to prevent delamination or other moistures related damage to the transducer layer structure.

A protective cover 38 is further laminated over the shielding layer 36. The protective cover 38 also covers the layering of the transducer, providing further moisture and mechanical protection thereto.

The specific details of the flexible double sided connector used in accordance with the teachings of the present application are better illustrated with reference to FIG. 2 which is a magnified partial view of the structure of FIG. 1. The flexible double sided connector or circuit 22 is preferably formed of a flexible non-conductive substrate 24, in the preferred embodiment a polyimide film such as that marketed under the trademark Kapton by E. I. Dupont Co., or an equivalent film. Suitable first and second connector conductors 26, 28 are provided on opposed sides of the flexible insulated substrate 24. In the preferred embodiment, a suitable wiring pattern, as described in further detail with reference to the remainder of the specification, is provided on one or both sides of this flexible double sided connector.

Prior to fastening the flexible double sided connector 22 to the conductively coated piezoelectric crystal 12, the end of the flexible double sided connector 22 is prepared for affixing through stepping the respective first connector conductor 26, flexible insulated substrate 24, and second connector conductor 28 so that a portion of each of these layers is presented on a single side of the flexible double sided connector 22. As can be seen from FIG. 2, a portion of the second connector conductor 28 extends beyond both the first connector conductor 26 and the flexible insulative substrate 24 to form an exposed second contact 28E. In similar fashion, the flexible insulative substrate 24 along with the second connector conductor 28 extend beyond the first connector conductor 26 to form an exposed gap insulating portion 241. Naturally, a portion of the first connector conductor 26 remains exposed and forms an exposed first contact 26E.

The flexible double sided connector 22 is then conductively affixed to the first and second piezoelectric electrodes 18, 20 by any suitable conductive bonding material. This is accomplished by aligning the exposed gap insulating portion 241 with one of the insulative gaps 16. The exposed first contact 26E is then bonded to the first piezoelectric electrode 18 with a first conductive contact bond 40 while the exposed second contact 28E is bonded to the second piezoelectric electrode 20 with a second conductive contact bond 41.

In accordance with one preferred embodiment of the present application, the first and second conductive contact bonds 40,41 are accomplished by use of a metallic solder. However, according to an alternative embodiment of the present applications, an anisotropic conductive adhesive can be used to produce the first and second conductive contact bonds 40, 41. It should be noted that the first conductive contact bond 40 preferably includes a connection strengthening fillet 42 which, in a solder construction extends up at least a major portion of the side wall of the conductively coated piezoelectric crystal 12. This fillet provides a strengthening to the connection between the flexible double sided connector 22 and the conductive coating 14.

The flexible double sided connector 22 is normally fastened to the conductively coated piezoelectric crystal prior to assembly of the remainder of the device. The piezoelectric crystal is then attached to the backing 30 by a suitable adhesive 31 and the remainder of the transducer is formed as would occur to one of ordinary skill in the art. Of course, the formation of the linear ultrasonic transducer requires the construction of plural ultrasonic transducer elements 10a–k as shown in FIG. 1. Typically this is produced by dicing the piezoelectric crystal after mounting to the backing. Thus, individual electrodes formed as part of the first or second connector conductors are aligned to connect to specific ultrasonic transducer elements 10a–k. Dicing is normally performed after the flexible double-sided connector 22 is attached. Thus, the end of the double sided flexible connector 22 is normally also diced.

The use of a flexible double-sided connector 22 allows considerable flexibility in the manner in which connections to the linear ultrasonic transducer 10 are arranged. FIG. 3 illustrates a first example of connection to the individual ultrasonic transducer elements 10a–10d through the use of a flexible double-sided connector 22. FIG. 3, as well as FIGS. 4 and 5, illustrate the underside of the conductively coated piezoelectric crystal and the manner in which the flexible double-sided connector 22 and its individual conductors are affixed thereto.

In the example of FIG. 3, the first connector conductor 26 is commonly connected to all of the ultrasonic transducer elements 10a–d as a first common or ground conductor 26C which is, in turn, connected to each of the first transducer element electrodes 18a–d. Thus, in this embodiment, the first transducer element electrodes 18a–d are commonly connected. The second connector conductor 28 then uses individual second individual connector conductors 28a–d to connect to the second transducer electrode elements 20a–d. Note that the insulative gap 16 is bridged by a exposed insulating portion 241 of the flexible insulative substrate 24. In this manner, individual second transducer electrode elements 20a–d are individually accessed while the first transducer element electrodes 18a–d are commonly connected. Of course, this arrangement could be reversed, in accordance with the teachings of the present application, and individual first transducer element electrodes 28a–d could be used to access the first transducer element electrodes 18a–d while a common ground conductor could be used to collectively contact the second transducer element electrodes 20a–d.

Note that the FIG. 3 embodiment contemplates that the flexible double-sided connector 22 will access the ultrasonic transducer from its edge, enabling the generation of a connection strengthening fillet 42. However, it is also possible for the flexible double-sided connector 22 to approach the gap 16 from the other direction, from the direction of the center of the transducer array, within the teachings of the present application.

Figure 4:
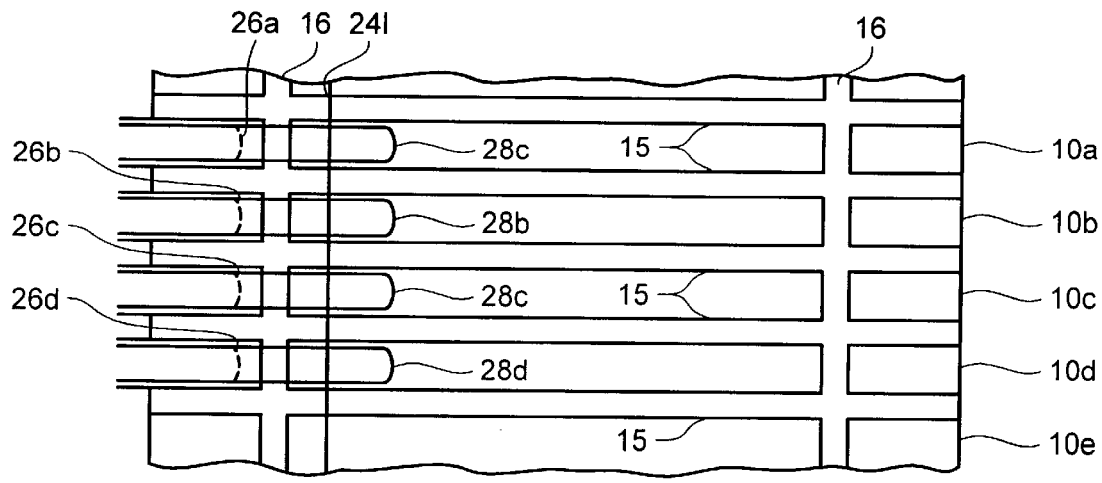
FIG. 4 is an alternative embodiment showing another example of the connection of the flexible double sided connector to the piezoelectric crystal and its associated piezoelectric crystal elements.
Figure 5:
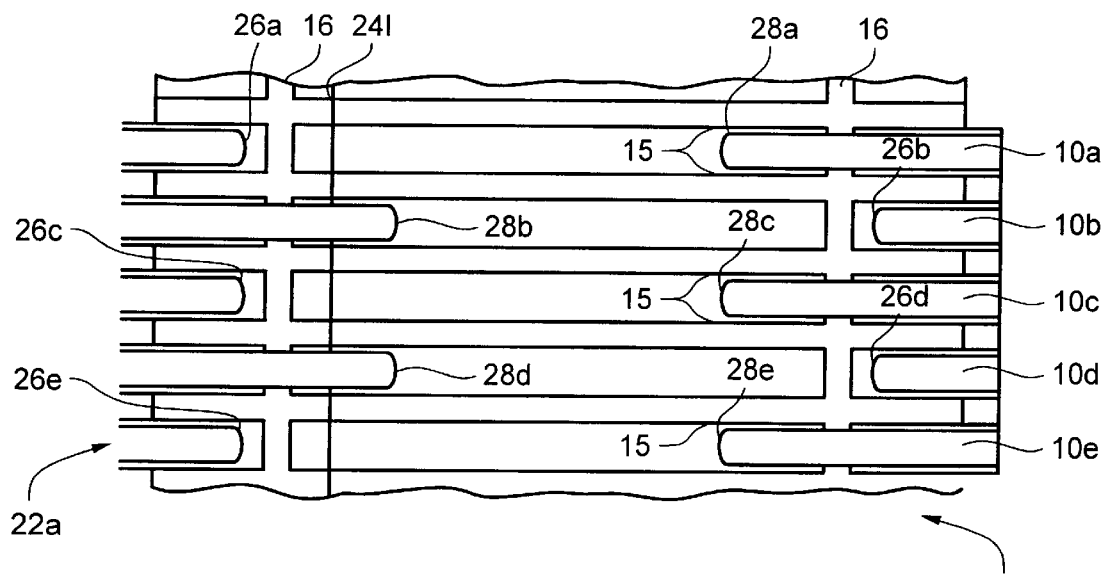
FIG. 5 is still another embodiment of the connection of the flexible double sided connector 22 to the piezoelectric crystal and its associated elements. In this embodiment, two double sided flexible connectors are utilized so that the pitch or separation between the wirings of adjacent connectors can be increased.

FIG. 4 illustrates an alternative embodiment where both the first and second individual connector conductors 26a–d and 28a–d each individually contact individual first and second transducer element electrodes 18a–d, 20a–d. Thus, in the embodiment of FIG. 4 no common electrode is used for certain advantageous reasons. Otherwise, the embodiment of FIG. 4 is substantially identical to the embodiment of FIG. 3.

FIG. 5 illustrates another alternative embodiment of the transducer connection of the present application. In FIG. 5, first and second flexible double sided connectors 22a, 22b are collectively used to access the individual ultrasonic transducer elements 20a–e. As the size of individual ultrasonic transducer elements decreases, the size of the individual connector conductors 26a–k, 28a–k creates increasing problems, not only due to shrinkage of the connector lithography, but also due to registration problems. These problems can be greatly reduced by only connecting to every other ultrasonic transducer element using a single flexible double sided connector 22a or 22b. Thus, in the embodiment of FIG. 5, the first connector conductor 26 of the first double sided conductor 22a connects only to odd first individual connector conductors 26a, 26c, 26e, while the second connector conductor 28 of the first double sided conductor 26a connects to only even first individual connector conductors 26b, 26d. Similarly, the first connector conductor 26 of the second double sided conductor 22b connects only to even first individual connector conductors 26b, 26d, while the second connector conductor 28 of the second double sided conductor 22b connects to only odd first individual connector conductors 26a, 26c, 26e.

In a two double sided conductor embodiment, there are two principal alternatives. In the embodiment shown in FIG. 5, the second connector conductor connects to different ultrasonic transducer elements than are connected to by the first connector conductor 26. Thus, whereas the first connector conductor 26 of the first flexible double sided conductor 26a connects to odd ultrasonic transducer elements 10a, 10c, 10e, the second connector conductor in the embodiment of FIG. 5 connects to even ultrasonic transducer elements 10b, 10d. The same is true of the second flexible double sided connector 22b in which the second connector conductor 28 connects to odd second individual connector conductors 28a, 28c, 28e. Of course, the relationship between the first and second connector conductors 26, 28 may be reversed in accordance with the teachings of the present invention so that the first flexible double sided connector 28a has first and second connector conductors 26, 28 which both connect to odd ultrasonic transducer elements 10a, 10c, 10e while the corresponding first and second connector conductors 26, 28 of the second flexible double sided conductor 28b connect to even ultrasonic transducer elements 10b, 10d. Either of these solutions provides substantial advantages in increasing transducer element density, thereby enabling increased imaging resolution.

FIG. 6 shows a further alternative embodiment of the present application where the first connector conductors 26 and second connector conductors 28 drive alternate ultrasonic transducer elements with reversed polarity, driving the first transducer element electrodes 18a, 18c, and 18e with one polarity while driving the first transducer element electrodes 18b, 18d with the reversed polarity. This results in reduction of noise in the overall device.

Although, for simplicity, the embodiments illustrated in the present application are linear, one dimensional arrays, the principals of the present application may also be applied to curvilinear otherwise transducers. Such curvilinear transducers may be curved in the longitudinal or transverse direction to accomplish various focusing objectives as would occur to one of ordinary skill in the art. However, the principals of the present application are equally applicable to such curvilinear transducer arrays.

It is apparent from the foregoing description that applicants have invented an improved transducer array. It should be apparent from the foregoing that there are various modifications which would be made within the contemplation of one or ordinary skill in the art. The scope of the present application should include such modifications and is defined solely by the appended claims.

what is claimed is:

1. An ultrasonic transducer comprising:
   a piezoelectric crystal divided into plural elements extending along a first direction;
   first and second electrode layers sandwiching said piezoelectric crystal and interacting with each of said plural elements to transduce ultrasound;
   a concave acoustic lens having a concave shape in a transverse direction orthogonal to said first direction and having an acoustic velocity of greater than that of water, said acoustic lens focussing energy emitted from said piezoelectric crystal at a focal point; and
   a double sided flexible circuit having first and second conductive wirings provided on opposed sides of a dielectric flexible substrate, a connection end of said flexible circuit being connected to said first and second electrode layer contacts,
   wherein, at said connection end, said dielectric flexible substrate extends beyond said first conductive wiring while said second conductive wiring extends beyond said dielectric flexible substrate so that said connection end has said first conductive wiring, said dielectric flexible substrate and said second flexible substrate collectively form a stepped end structure with both of said conductive wirings being exposed on a single first side of said double sided flexible substrate.

2. The ultrasonic transducer of claim 1 wherein the acoustic velocity of said concave acoustic lens is greater than 1700 m/s.

3. The ultrasonic transducer of claim 2 wherein said concave acoustic lens is made of an epoxy or urethane material.

4. The ultrasonic transducer of claim 3 wherein at least one acoustic matching layer is provided between said piezoelectric crystal and said concave acoustic lens.

5. The ultrasonic transducer of claim 1 wherein said transducer is linear or curvilinear.

6. An ultrasonic transducer comprising:
   a backing;
   a layer structure formed on said backing including;
   a piezoelectric crystal divided into plural elements extending along a first direction;
   first and second electrode layers sandwiching said piezoelectric crystal and interacting with each of said plural elements to transduce ultrasound; and
   an acoustic lens;
   a shielding layer covering substantially all of said layer structure and extending onto said backing, said shielding layer providing electronic and moisture protection to said layer structure; and
   a double sided flexible circuit having first and second conductive wirings provided on opposed sides of a dielectric flexible substrate, a connection end of said flexible circuit being connected to said first and second electrode layer contacts,
   wherein, at said connection end, said dielectric flexible substrate extends beyond said first conductive wiring while said second conductive wiring extends beyond said dielectric flexible substrate so that said connection end has said first conductive wiring, said dielectric flexible substrate and said second flexible substrate collectively form a stepped end structure with both of said conductive wirings being exposed on a single first side of said double sided flexible substrate.

7. The ultrasonic transducer of claim 6, wherein said acoustic lens covers substantially all of the remainder of said layer structure and extends onto said backing to provide mechanical and moisture protection to the remainder of said layer structure.

8. The ultrasonic transducer of claim 6 wherein said transducer is linear or curvilinear.

9. An ultrasonic transducer comprising:
   a backing;
   a layer structure formed on said backing including;
   a piezoelectric crystal divided into plural elements extending along a first direction;
   first and second electrode layers sandwiching said piezoelectric crystal and interacting with each of said plural elements to transduce ultrasound;
   a concave acoustic lens having a concave shape in a transverse direction orthogonal to said first direction and having an acoustic velocity of greater than that of water, said acoustic lens focussing energy emitted from said piezoelectric crystal at a focal point;

a shielding layer covering substantially all of said layer structure and extending onto said backing, said shielding layer providing electronic and moisture protection to said layer structure; and a double sided flexible circuit having first and second conductive wirings provided on opposed sides of a dielectric flexible substrate, a connection end of said flexible circuit being connected to said first and second electrode layer contacts, wherein, at said connection end, said dielectric flexible substrate extends beyond said first conductive wiring while said second conductive wiring extends beyond said dielectric flexible substrate so that said connection end has said first conductive wiring, said dielectric flexible substrate and said second flexible substrate collectively form a stepped end structure with both of said conductive wirings being exposed on a single first side of said double sided flexible substrate.

10. The ultrasonic transducer of claim 9, wherein the acoustic velocity of said concave acoustic lens is greater than 1700 m/s.

11. The ultrasonic transducer of claim 9, wherein said concave acoustic lens is made of an epoxy or urethane material.

12. The ultrasonic transducer of claim 9, wherein at least one acoustic matching layer is provided between said piezoelectric crystal and said concave acoustic lens.

13. The ultrasonic transducer of claim 9, wherein said transducer is linear or curvilinear.

14. The ultrasonic transducer of claim 9, wherein said acoustic lens covers substantially all of the remainder of said layer structure and extends onto said backing to provide mechanical and moisture protection to the remainder of said layer structure.

15. The ultrasonic transducer of claim 9, wherein said first and second conductive wirings both include individual connections for each of said plural elements.

* * * * *